(12) United States Patent
Kwak

(10) Patent No.: US 7,429,518 B2
(45) Date of Patent: Sep. 30, 2008

(54) METHOD FOR FORMING SHALLOW TRENCH ISOLATION OF SEMICONDUCTOR DEVICE

(75) Inventor: Sung Ho Kwak, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 81 days.

(21) Appl. No.: 11/617,209

(22) Filed: Dec. 28, 2006

(65) Prior Publication Data

US 2007/0155125 A1 Jul. 5, 2007

(30) Foreign Application Priority Data

Dec. 30, 2005 (KR) .................. 10-2005-0134875

(51) Int. Cl.
*H01L 21/76* (2006.01)

(52) U.S. Cl. .................. 438/421; 438/400; 257/E21.54
(58) Field of Classification Search ................ 438/400, 438/421; 257/E21.54
See application file for complete search history.

(56) References Cited

U.S. PATENT DOCUMENTS

| | | | | |
|---|---|---|---|---|
| 5,294,476 A | * | 3/1994 | Calhoun | .................. 428/195.1 |
| 2007/0187357 A1 | * | 8/2007 | Guerriero | .................. 216/41 |

* cited by examiner

*Primary Examiner*—Bradley K Smith
(74) *Attorney, Agent, or Firm*—Sherr & Vaughn, PLLC

(57) ABSTRACT

A shallow trench isolation well is formed to be very thin in a highly integrated semiconductor device. When critical dimension (CD) is small, it is difficult to reduce the width of the photosensitive layer pattern for forming a trench to no more than a predetermined value due to limitations on the photolithography process.

7 Claims, 3 Drawing Sheets

METHOD FOR FORMING SHALLOW TRENCH ISOLATION OF SEMICONDUCTOR DEVICE

The present application claims priority under 35 U.S.C. 119 and 35 U.S.C. 365 to Korean Patent Application No. 10-2005-0134875 (filed on Dec. 30, 2005), which is hereby incorporated by reference in its entirety.

BACKGROUND

In order to realize a highly integrated semiconductor device, various semiconductor elements that constitute the semiconductor devices such as transistors, capacitors, and various interconnections must be formed in a very narrow region. With a short distance between the components, insulation between the components should be reinforced.

In related art, as a means for electrically separating semiconductor elements that constitute a semiconductor device, a LOCOS type field oxide layer formed by locally oxidizing a silicon substrate may be used. However, in the LOCOS type field oxide layer, "bird's beak" regions generated during the process of forming the active regions may allow the semiconductor elements to partially invade an active region. This hampers efforts to realize a highly integrated semiconductor device.

Therefore, a field oxide layer that is formed in a small region and that has excellent insulation properties such as a trench type field oxide layer is required. In particular, shallow trench isolation (hereinafter, referred to as STI) may be used for this purpose.

Referring to FIG. 1, a related method of forming STI will be described as follows. A pad oxide layer 13 and a pad nitride layer 15 are sequentially formed in the silicon substrate 10.

After applying a photosensitive agent over the pad nitride layer 15, a photosensitive layer pattern (not shown) that distinguishes an active region from a field region of the substrate is formed by a photolithography process.

The pad nitride layer 15 and the pad oxide layer 13 are sequentially etched using the photosensitive layer pattern as a mask. In an adjunct process, the inside of the substrate 10 is etched to a predetermined depth to form a trench 18. After forming the trench 18, the photosensitive layer pattern is removed through a cleansing process.

Then, a thin STI lining oxide is formed in the trench 18 through a thermal oxidation process to modifies the surface of silicon. Then, a trench oxide layer 19 such as a CVD oxide using a TEOS oxidation film and a high density plasma CVD oxide is buried in the trench.

The trench oxide layer 19 is deposited over the entire surface of the pad nitride layer 15. Since the surface of the trench oxide layer is not even due to the unevenness there under immediately after the trench oxide layer is buried in the trench 18, the entire surface of the trench oxide layer 19 is planarized using a CMP process in order to perform subsequent processes.

Then, the pad oxide layer 13 and the pad nitride layer 15 over the substrate 10 are wet etched and removed so that the STI used as a device isolation layer is completed.

STI is designed to take up a small area over a highly integrated semiconductor device. In the semiconductor device, when critical dimension (CD) is very small, it becomes difficult to reduce the width of the photosensitive layer pattern for forming a trench to no more than a predetermined value due to limitations on the photolithography process.

SUMMARY

Embodiments relate to a method of forming thinner and deeper shallow trench isolation (STI) using a copper layer.

Embodiments have been made to solve the above problem occurring in the related art, and therefore, it is an object of the embodiments to provide a method of forming STI in which a copper layer is used as a mask in an STI process to form a thinner and deeper trench.

In order to achieve the above object, there is provided a method of forming shallow trench isolation (STI) of a semiconductor device including forming a photosensitive layer pattern over a semiconductor substrate using a photolithography process. A copper layer is formed over the substrate where the photosensitive layer pattern is formed. The copper layer is planarized using a CMP process until a surface of the photosensitive layer pattern is exposed. The photosensitive layer pattern is removed through a wet etching process. The substrate is etched using the copper layer as a mask to form a trench. The copper layer is removed from the substrate. A trench oxide layer is formed over the substrate where the trench is formed. The trench oxide layer is planarized using the CMP process. The copper layer may be formed using an electro-chemical plating (ECP) method. The wet etching process may be performed using SC-1 or SC-2 cleansing solution.

DETAILED DESCRIPTION

Figure 1:
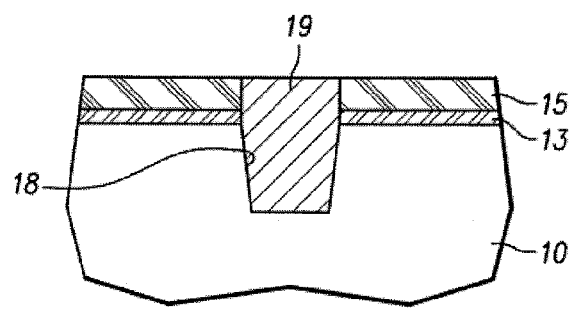
FIG. 1 illustrates the shape of the trench of STI formed by a related method; and Example
Figure 2:
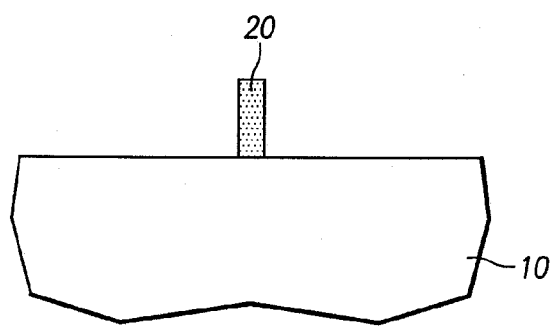
FIGS. 2 to 7 are sectional views sequentially illustrating a method of forming the STI of a semiconductor device according to embodiments.

Referring to FIG. 2, a photosensitive layer pattern 20 is formed over a semiconductor substrate 10 using a photolithography process. Here, the photosensitive layer pattern 20 is used for forming a trench. The width of the photosensitive layer pattern 20 determines the width of the trench.

Figure 3:
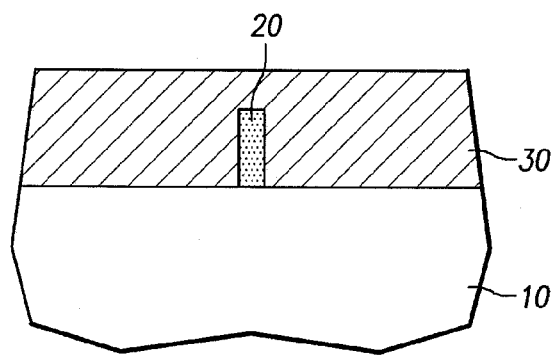

Then, as illustrated in FIG. 3, a copper layer 30 is formed over the substrate where the photosensitive layer pattern 20 is formed. Here, the copper layer 30 is formed using an electro-chemical plating (ECP) method.

Figure 4:
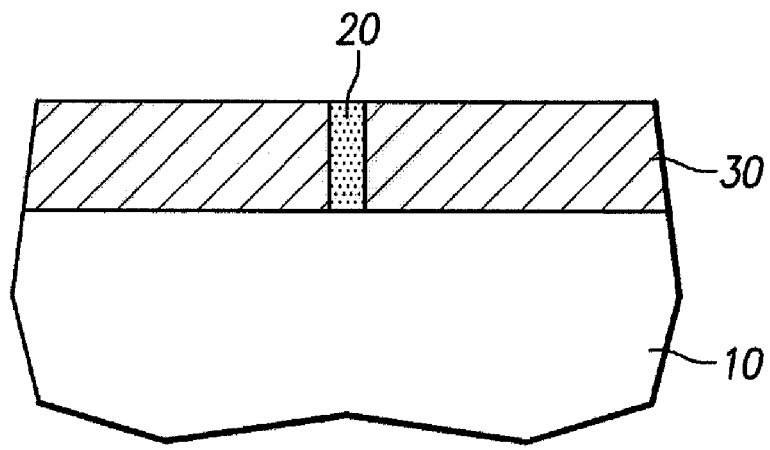

Then, as illustrated in FIG. 4, the copper layer 30 is planarized using a CMP process until the interface of the photosensitive layer pattern 20 is exposed.

Figure 5:
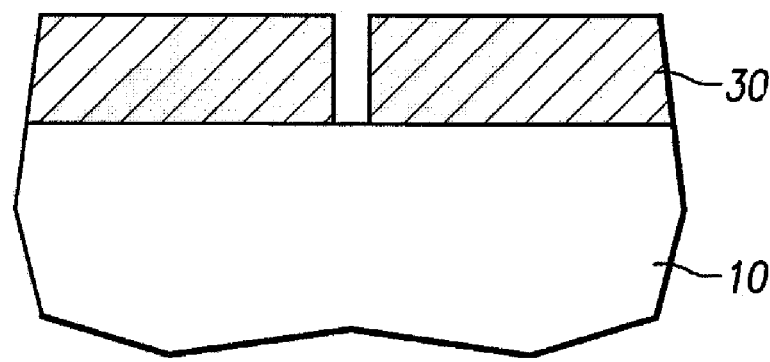

Then, as illustrated in FIG. 5, the photosensitive layer pattern 20 is removed through a wet etching process. During the wet etching process, a photosensitive layer is removed using SC-1 or SC-2 cleansing solution. SC-1 is a cleansing agent composed of $NH_4OH$, $H_2O_2$, and $H_2O$ and SC-2 is a cleansing agent composed of $H_2O_2$ and $H_2O$.

Figure 6:
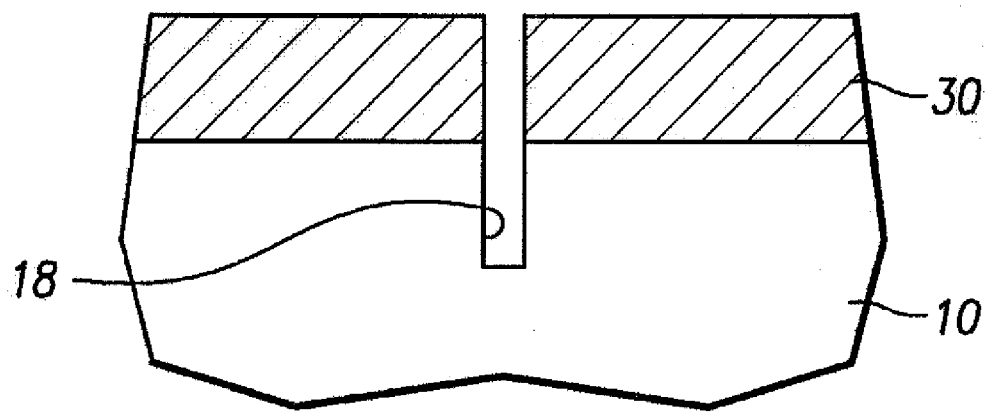

Then, as illustrated in FIG. 6, the substrate 10 is etched using the copper layer 30 as a mask to form a trench 18. At this time, since the selectivity of the copper layer 30 with respect to the substrate 10 is high, it is possible to form a deep trench 18. That is, it is possible to form a deeper trench 18 than in the case where the substrate 10 is etched using the photosensitive layer as the mask.

Also, since the selectivity of the copper layer 30 with respect to the substrate 10 is high, it is possible to reduce the height of the photosensitive pattern 20 that determines the height of the copper layer 30. The lower the photosensitive layer pattern 20 is, the narrower the photosensitive pattern may be made. The narrower the photosensitive layer pattern 20, the thinner the trench 18 is.

Figure 7:
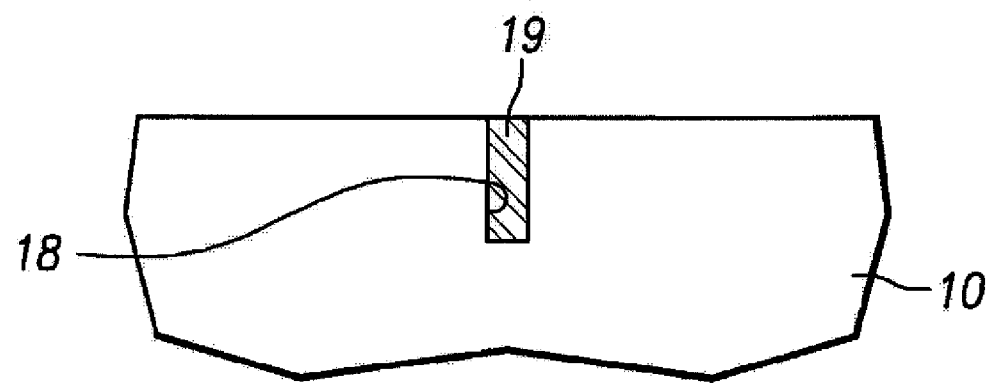

Therefore, since a low and narrow photosensitive layer pattern can be formed when the copper layer 30 is used as the mask, it is possible to form a thinner and deeper trench 18. Then, as illustrated in FIG. 7, the copper layer 30 over the substrate 10 is removed.

Then, a trench oxide layer 19 is formed in the trench 18. Then, the entire surface of the trench oxide layer 19 is planarized using the CMP process to complete the STI.

In the method of forming the STI of the semiconductor device according to embodiments, since the copper layer having a high selectivity with respect to the substrate is used as the mask, it is possible to form a deeper trench than in the case where the substrate is etched using the photosensitive layer as the mask.

Also, according to embodiments, since the copper layer used as the mask has the high selectivity with respect to the substrate, it is possible to reduce the height of the photosensitive layer pattern that determines the height of the copper layer. Therefore, since it is possible to form a thinner photosensitive pattern, it is possible to form a thinner trench.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
    forming a photosensitive layer pattern over a semiconductor;
    forming a copper layer over the substrate where the photosensitive layer pattern is formed;
    planarizing the copper layer using a CMP process until a surface of the photosensitive layer pattern is exposed;
    removing the photosensitive layer pattern; and
    etching the substrate using the copper layer as a mask to form a trench.

2. The method of claim 1, wherein the removal of the photosensitive layer pattern is performed by a wet etching process.

3. The method of claim 2, wherein the wet etching process is performed using one of an SC-1 and an SC-2 cleansing solution.

4. The method of claim 1, further including removing the copper layer on the substrate.

5. A method of forming an isolation trench of a semiconductor device comprising:
    forming a photosensitive layer pattern over a semiconductor substrate using a photolithography process;
    forming a copper layer over the substrate where the photosensitive layer pattern is formed;
    planarizing the copper layer using a CMP process until a surface of the photosensitive layer pattern is exposed;
    removing the photosensitive layer pattern through a wet etching process;
    etching the substrate using the copper layer as a mask to form a trench;
    removing the copper layer on the substrate;
    forming a trench oxide layer over the substrate where the trench is formed; and
    planarizing the trench oxide layer using the CMP process.

6. The method of claim 5, wherein the copper layer is formed using an electro-chemical plating (ECP) method.

7. The method of claim 5, wherein the wet etching process is performed using SC-1 or SC-2 cleansing solution.

* * * * *